United States Patent
Lim et al.

(10) Patent No.: US 6,723,598 B2
(45) Date of Patent: Apr. 20, 2004

(54) METHOD FOR MANUFACTURING ALUMINUM OXIDE FILMS FOR USE IN SEMICONDUCTOR DEVICES

(75) Inventors: Chan Lim, Ichon-shi (KR); Kyong-Min Kim, Ichon-shi (KR); Yong-Sik Yu, Ichon-shi (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/736,384

(22) Filed: Dec. 15, 2000

(65) Prior Publication Data

US 2001/0051444 A1 Dec. 13, 2001

(30) Foreign Application Priority Data

Dec. 29, 1999 (KR) .......................... 1999-65029

(51) Int. Cl.[7] .......................................... H01L 21/8242
(52) U.S. Cl. ..................... 438/240; 438/250; 257/310
(58) Field of Search ................. 438/3, 392, 240, 438/239, 250, 253, 778; 257/301; 365/200

(56) References Cited

U.S. PATENT DOCUMENTS 6,144,060 A * 11/2000 Park et al. .................. 257/298
6,255,122 B1 * 7/2001 Duncombe et al. ............. 438/3
6,287,965 B1 * 9/2001 Kang et al. ................. 438/648
6,305,314 B1 * 10/2001 Sneh et al. ............... 118/723 E
2001/0024387 A1 * 9/2001 Raaijmakers et al. ........ 365/200
2002/0000598 A1 * 1/2002 Kang et al. ................. 257/301
2002/0020868 A1 * 2/2002 Yang et al. ................. 257/303

\* cited by examiner

*Primary Examiner*—W. David Coleman
(74) *Attorney, Agent, or Firm*—Finnegan, Henderson, Farabow, Garrett & Dunner, L.L.P.

(57) ABSTRACT

A method for manufacturing an aluminum oxide film for use in a semiconductor device, the method including the steps of preparing a semiconductor substrate and setting the semiconductor substrate in a reaction chamber, supplying an aluminum source material and $NH_3$ gas into the reaction chamber simultaneously for being absorbed on the semiconductor substrate, discharging unreacted MTMA or by-product by flowing nitrogen gas into the reaction chamber or vacuum purging, supplying an oxygen source material into the reaction chamber for being absorbed on the semiconductor substrate, and discharging unreacted oxygen source or by-product by flowing nitrogen gas into the reaction chamber or vacuum purging.

32 Claims, 6 Drawing Sheets

METHOD FOR MANUFACTURING ALUMINUM OXIDE FILMS FOR USE IN SEMICONDUCTOR DEVICES

FIELD OF THE INVENTION

The present invention relates to a method for manufacturing a semiconductor device; and, more particularly, to the method for manufacturing an aluminum oxide for use in the semiconductor device by employing $NH_3$ reactive gas to deposit an aluminum source and/or an oxygen source on a wafer.

DESCRIPTION OF THE PRIOR ART

As is well known, a semiconductor device has a higher degree of integration mainly by downsizing through micronization nowadays. However, there is still a demand for downsizing the area of the memory cell, under increased transistor and circuit speeds and improved reliability. Such demands for increased density, performance and reliability require formation of device features with high precision and miniaturization. To meet the demand, it is necessary to increase a capacitance of a capacitor and improve a gate dielectric film which is applied for a DRAM and a logic devices. In attempt to solve an above requirement, various researches have been advanced to employ the high dielectric materials for a capacitor thin film and a gate dielectric film.

In particular, among the high dielectric materials, aluminum oxide ($Al_2O_3$) is typically used for the capacitor thin film and the gate dielectric thin film because the aluminum oxide has good oxidation resistance property and thermal stability. Furthermore, it can be popularly used as a hydrogen barrier for preventing hydrogen diffusion.

Generally, the aluminum oxide film is formed by using a method such as an atomic layer deposition (ALD). In more detail, a manufacturing steps are as follows: setting a wafer in a chamber; heating up the wafer to 200° C. to 450° C.; supplying an aluminum source material into the chamber for 0.1 to 3 seconds; flowing $N_2$ gas into the chamber or vacuum purging for sweeping off unreacted aluminum source material and by-product; supplying an oxygen source material into the chamber for 0.1 to 3 seconds; and flowing $N_2$ gas into the chamber or vacuum purging for sweeping off unreacted oxygen source material and by-product, again. This is one cycle for depositing the aluminum oxide film. Thus, by repeating this cycle more and more, intended thickness of aluminum oxide film is obtained.

In conventional method for manufacturing aluminum oxide film in the semiconductor device, trimethyl aluminum (TMA, $Al(CH_3)_3$) or modified trimethyl aluminum (MTMA, $Al(CH_3)_3N(CH_2)_5CH_3$) is used as the aluminum source material and vaporized water is usually used as the oxygen source material.

However, the conventional method has a drawback that a growth rate of the aluminum oxide is very slow so that productivity may decrease. And further, the aluminum oxide film formed by the conventional method may contain carbon particles therein due to use of an organic material such as TMA or MTMA, thereby an electrical property thereof being deteriorated.

SUMMARY OF THE INVENTION

It is, therefore, an object of the present invention to provide a method for manufacturing an aluminum oxide film for use in a semiconductor device by applying $NH_3$ reactive gas for improving a growth rate of the aluminum oxide film.

It is another object of the present invention to provide a method for manufacturing a semiconductor device incorporating therein an aluminum oxide film by applying $NH_3$ reactive gas for improving a growth rate of the aluminum oxide film.

In accordance with one aspect of the present invention, there is provided a method for manufacturing an aluminum oxide film for use in a semiconductor device, the method comprising the steps of: a) preparing a semiconductor substrate and setting the semiconductor substrate in a reaction chamber; b) supplying an aluminum source material and $NH_3$ gas into the reaction chamber simultaneously for being absorbed on the semiconductor substrate; c) discharging unreacted MTMA or by-product by flowing nitrogen gas into the reaction chamber or vacuum purging; d) supplying an oxygen source material into the reaction chamber for being absorbed on the semiconductor substrate; and e) discharging unreacted oxygen source or by-product by flowing nitrogen gas into the reaction chamber or vacuum purging.

In accordance with another aspect of the present invention, there is provided a method for manufacturing an aluminum oxide film for use in a semiconductor device, the method comprising the steps of: a) preparing a semiconductor substrate and setting the semiconductor substrate in a reaction chamber; b) supplying an aluminum source material into the reaction chamber for being absorbed on the semiconductor substrate; c) discharging unreacted MTMA or by-product by flowing nitrogen gas into the reaction chamber or vacuum purging; d) supplying an oxygen source material and $NH_3$ gas into the reaction chamber for being absorbed on the semiconductor substrate; and e) discharging unreacted oxygen source or by-product by flowing nitrogen gas into the reaction chamber or vacuum purging.

In accordance with still another aspect of the present invention, there is provided a method for manufacturing an aluminum oxide film for use in a semiconductor device, the method comprising the steps of: a) preparing a semiconductor substrate and setting the semiconductor substrate in a reaction chamber; b) supplying an aluminum source material and $NH_3$ gas into the reaction chamber simultaneously for being absorbed on the semiconductor substrate; c) discharging unreacted MTMA or by-product by flowing nitrogen gas into the reaction chamber or vacuum purging; d) supplying an oxygen source material and $NH_3$ gas into the reaction chamber for being absorbed on the semiconductor substrate; and e) discharging unreacted oxygen source or by-product by flowing nitrogen gas into the reaction chamber or vacuum purging.

In accordance with further still another aspect of the present invention, there is provided a method for manufacturing a semiconductor device, the method comprising the steps of: a) preparing an active matrix provided with a substrate, isolation regions, gate line, gate oxide and a first insulating layer; b) forming a buffer layer and a first conductive layer on the active matrix subsequently; c) forming a dielectric layer of aluminum oxide ($Al_2O_3$) on the first conductive layer using an ALD technique, by supplying $NH_3$ reactive gas with an aluminum source and/or an oxygen source; d) forming a second conductive layer on the dielectric layer and patterning the second conductive layer, the dielectric layer, the first conductive layer and the buffer layer, thereby obtaining a capacitor structure; e) forming a hydrogen barrier layer on the capacitor structure; f) forming a bit line and a local interconnection after depositing a second insulating layer; g) forming a passivation layer on entire surface.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
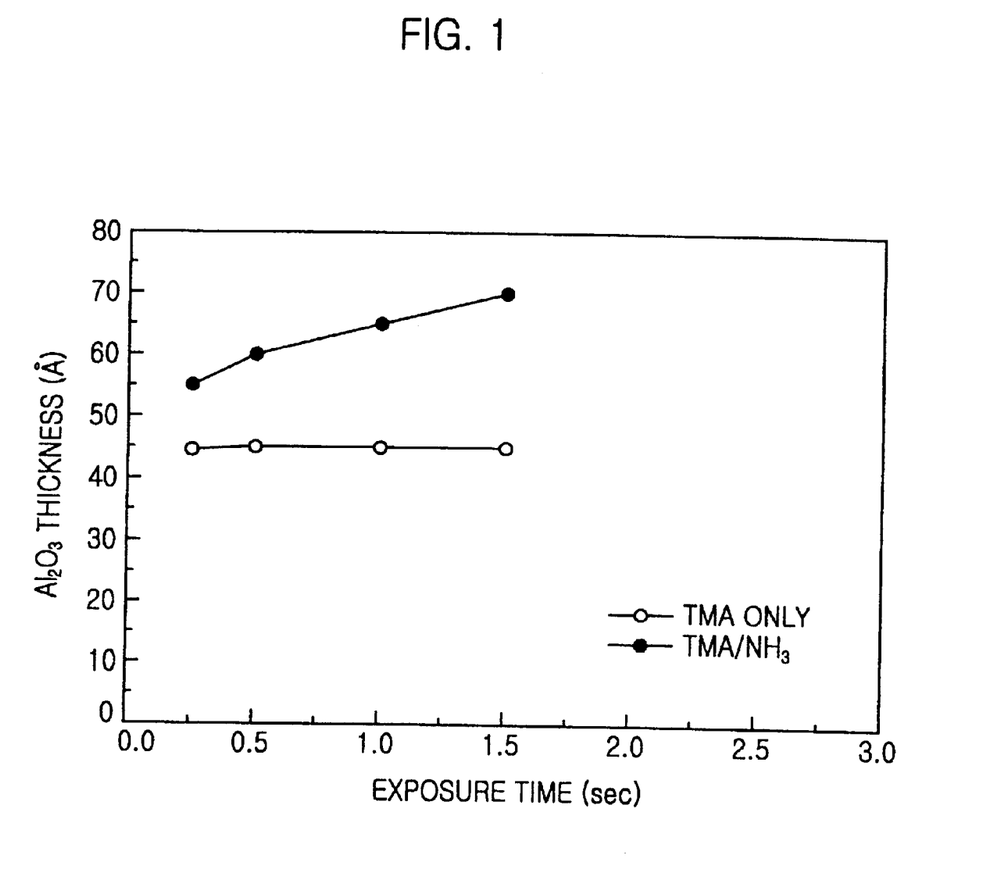
FIGS. 1, 2, and 3 are graphs of an exposure time versus a thickness of a wafer after depositing an aluminum oxide film by an atomic layer deposition (ALD) technique in accordance with preferred embodiments of the present invention.

Referring to FIG. 1, there is a graph of an exposure time versus a thickness of a wafer after depositing an aluminum oxide film during 50 cycles by an atomic layer deposition (ALD) technique in accordance with a first preferred embodiment of the present invention.

In the first embodiment, an aluminum source material and $NH_3$ gas are supplied into a reaction chamber simultaneously for enhancing a growth rate of the aluminum oxide film. In comparison with a prior art in which $NH_3$ gas is not employed, the growth rate of the aluminum oxide film in accordance with the present invention is remarkably higher than that of the prior art. And further, as the exposure time increases on and on, the growth rate increases also.

The process for manufacturing the aluminum oxide film is illustrated in more detail hereunder. To begin with, the aluminum source material and $NH_3$ gas are supplied into the reaction chamber simultaneously after setting the wafer in the reaction chamber, for being absorbed on a surface of the wafer. And then, a first purge is carried out for sweeping off unreacted aluminum oxide and by-product after stopping supplying the aluminum source. In a next step, oxygen source material is supplied into the reaction chamber for being absorbed on the surface of the wafer. Thereafter, a second purge is carried out for sweeping off unreacted oxygen source material and by-product. This is one cycle for depositing the aluminum oxide film. Repeating the cycle many times, the aluminum oxide film with an intended thickness is formed on the wafer. After depositing the aluminum oxide completely, an annealing process is performed for densifying the aluminum oxide film.

Here, a deposition temperature is kept up to 200° C. to 450° C. and the pressure in the chamber is kept at 50 mTorr to 300 mTorr. The aluminum source material, e.g., trimethyl aluminum (TMA, $Al(CH_3)_3$) or modified trimethyl aluminum (MTMA, $Al(CH_3)_3N(CH_2)_5CH_3$), is supplied through a first supply-pipe for 0.1 to 3 seconds. Meanwhile, $NH_3$ gas is supplied into the reaction chamber simultaneously through a second supply-pipe, a flow rate being 20 to 1,000 standard cubic centimeters per minute (sccm). If $NH_3$ gas and the aluminum source material are supplied into the chamber through the same supply-pipe, the aluminum source reacts with $NH_3$ gas, thereby producing particles in the supply-pipe. Thus, the aluminum source material and $NH_3$ gas should be supplied through each separate supply-pipe. The first purge is carried out for 0.1 to 3 seconds to discharge unreacted aluminum source material and by-product through a discharge pump, but it may be carried out by using a method such as a vacuum purging. In addition, the oxygen source material, e.g., vaporized water, is supplied for 0.1 to 3 seconds through a third supply-pipe, and then, the second purge is carried out as similar to the first purge.

Since the aluminum oxide film employs metal-organic material such as TMA or MTMA, the aluminum oxide film contains carbon particles therein after deposition reaction, thereby deteriorating electrical property at last. To avoid the deterioration of electrical property, a following process is carried out at 300° C. to 450° C., by using a method such as $O_2$ plasma, $N_2O$ plasma, $UV/O_3$ or the like. And further, an annealing process is performed at 650° C. to 850° C. for densifying the aluminum oxide film.

Figure 2:
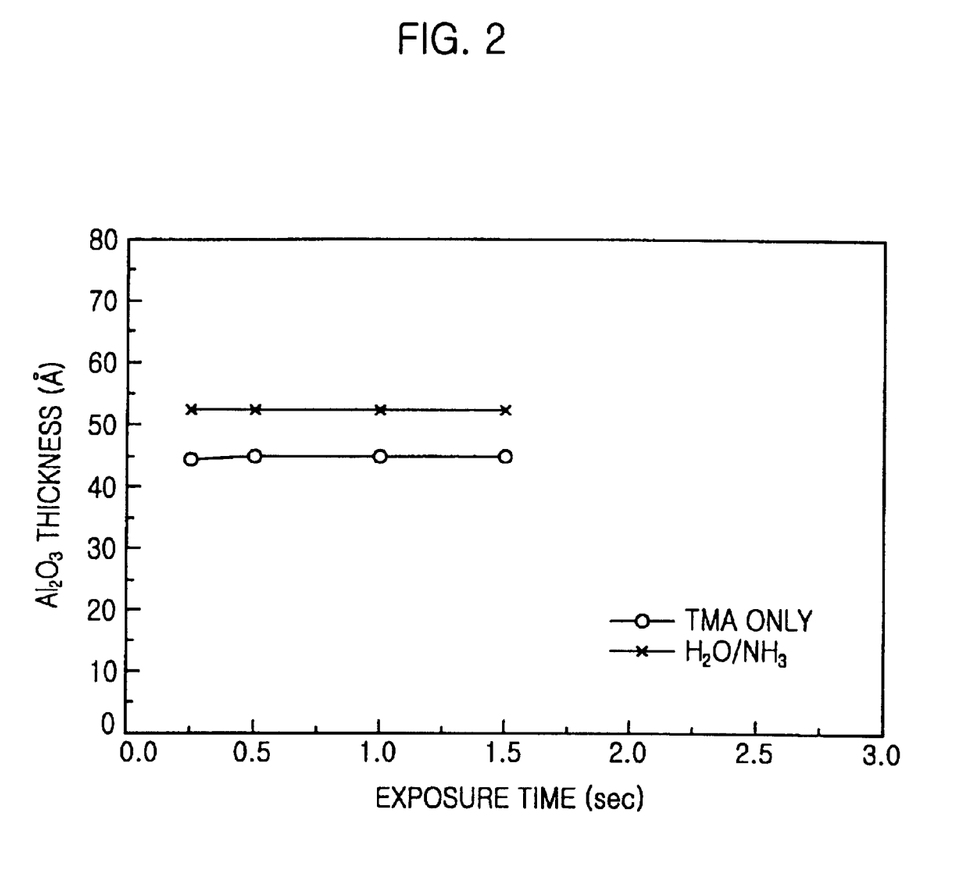

Referring to FIG. 2, there is another graph of an exposure time versus a thickness of a wafer after depositing an aluminum oxide film during 50 cycles by an atomic layer deposition (ALD) technique in accordance with a second preferred embodiment of the present invention.

In the second embodiment, an oxygen source material and $NH_3$ gas are supplied into a reaction chamber simultaneously for enhancing a growth rate of the aluminum oxide film. In comparison with a prior art in which $NH_3$ gas is not employed, the growth rate of the aluminum oxide film in accordance with the present invention is remarkably higher than that of the prior art. And further, as the exposure time increases on and on, the growth rate increases also.

The process for manufacturing the aluminum oxide film in accordance with the second embodiment is illustrated in more detail hereunder. To begin with, the aluminum source material is supplied into the reaction chamber after setting the wafer in the reaction chamber, for being absorbed on a surface of the wafer. And then, a first purge is carried out for sweeping off unreacted aluminum oxide and by-product after stopping supplying the aluminum source. In a next step, oxygen source material and $NH_3$ re supplied into the reaction chamber simultaneously for being absorbed on the surface of the wafer. Thereafter, a second purge is carried out for sweeping off unreacted oxygen source material and by-product. This is one cycle for depositing the aluminum oxide film. Repeating the cycle many times, the aluminum oxide film with an intended thickness is formed on the wafer. After depositing the aluminum oxide, a process for removing carbon particles an annealing process are performed sequentially.

Here, a deposition temperature is kept up to 200° C. to 450° C. and the pressure in the chamber is kept at 50 mTorr to 300 mTorr. The aluminum source material, e.g., trimethyl aluminum (TMA, $Al(CH_3)_3$) or modified trimethyl aluminum (MTMA, $Al(CH_3)_3N(CH_2)_5CH_3$), is supplied through a first supply-pipe for 0.1 to 3 seconds. The first purge is carried out for 0.1 to 3 seconds to discharge unreacted aluminum source material and by-product through a discharge pump, but it may be carried out by using a method such as a vacuum purging. In addition, the oxygen source material, e.g., vaporized water, and $NH_3$ gas are supplied for 0.1 to 3 seconds through the second supply-pipe, a flow rate being 20 to 1,000 sccm. And the second purge is carried out as similar to the first purge. Here, if the oxygen source material and $NH_3$ gas are supplied through each supply-pipe, there may be produced lot of particles in the chamber due to reaction of water and $NH_3$ gas. Thus, they should be supplied through the same supply-pipe.

Since the aluminum oxide film employs metal-organic material such as TMA or MTMA, the aluminum oxide film contains carbon particles therein after deposition reaction, thereby deteriorating electrical property at last. To avoid the deterioration of electrical property, a following process is carried out at 300° C. to 450° C., by using a method such as O₂ plasma, N₂O plasma, UV/O₃ or the like. And further, an annealing process is performed at 650° C. to 850° C. for densifying the aluminum oxide film.

Figure 3:
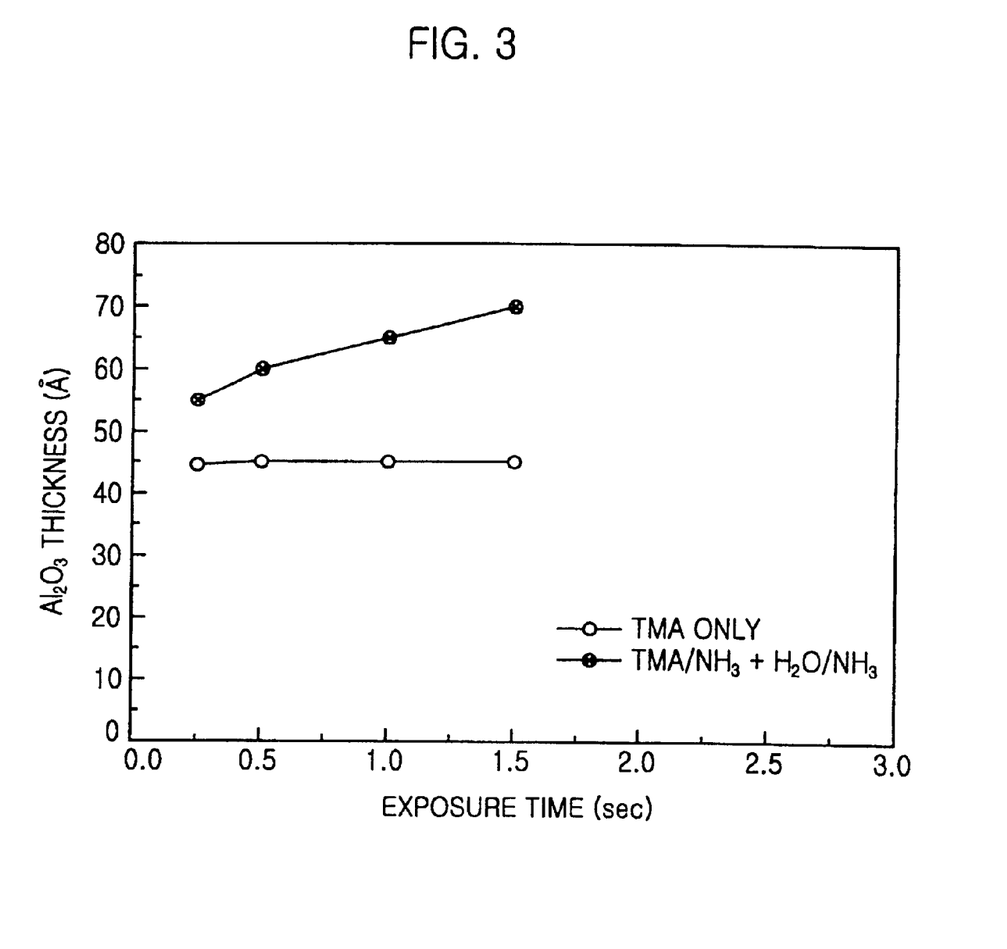

Referring to FIG. 3, there is still another graph of an exposure time versus a thickness of a wafer after depositing an aluminum oxide film for during cycles by an atomic layer deposition (ALD) technique in accordance with a third preferred embodiment of the present invention.

In the third embodiment, an aluminum source material and NH₃ gas are supplied into a reaction chamber simultaneously and further, an oxygen source material and NH₃ gas are also supplied simultaneously, for enhancing a growth rate of the aluminum oxide film. In comparison with a prior art in which NH₃ gas is not employed, the growth rate of the aluminum oxide film in accordance with the present invention is remarkably higher than that of the prior art. And further, as the exposure time increases on and on, the growth rate increases also.

The process for manufacturing the aluminum oxide film in accordance with the third embodiment is illustrated in more detail hereunder. To begin with, the aluminum source material and NH₃ gas are supplied into the reaction chamber simultaneously after setting the wafer in the reaction chamber, for being absorbed on a surface of the wafer. And then, a first purge is carried out for sweeping off unreacted aluminum oxide and by-product after stopping supplying the aluminum source. In a next step, oxygen source material and NH₃ gas are supplied into the reaction chamber simultaneously for being absorbed on the surface of the wafer. Thereafter, a second purge is carried out for sweeping off unreacted oxygen source material and by-product. This is one cycle for depositing the aluminum oxide film. Repeating the cycle many times, the aluminum oxide film with an intended thickness is formed on the wafer. After depositing the aluminum oxide, a process for removing carbon particles an annealing process are performed sequentially.

Here, a deposition temperature is kept up to 200° C. to 450° C. and the pressure in the chamber is kept at 50 mTorr to 300 mTorr. The aluminum source material, e.g., trimethyl aluminum (TMA, Al(CH₃)₃) or modified trimethyl aluminum (MTMA, Al(CH₃)₃N(CH₂)₅CH₃), is supplied through a first supply-pipe for 0.1 to 3 seconds. Meanwhile, NH₃ gas is supplied into the reaction chamber simultaneously through a second supply-pipe, a flow rate being 20 to 1,000 sccm. If NH₃ gas and the aluminum source material are supplied into the chamber through the same supply-pipe, the aluminum source reacts with NH₃ gas, thereby producing particles in the pipe. Thus, the aluminum source material and NH₃ gas should be supplied through each separate supply-pipe. The first purge is carried out for 0.1 to 3 seconds to discharge unreacted aluminum source material and by-product through a discharge pump, but it may be carried out by using a method such as a vacuum purging. In addition, the oxygen source material and NH₃ gas are supplied for 0.1 to 3 seconds through the third supply-pipe, a flow rate being 20 to 1,000 sccm. And the second purge is carried out as similar to the first purge. Here, if the oxygen source material and NH₃ gas are supplied through each separate supply-pipe, there may be produced lot of particles in the chamber due to reaction of water and NH₃ gas.

Since the aluminum oxide film employs metal-organic material such as TMA or MTMA, the aluminum oxide film contains carbon particles therein after deposition reaction, thereby deteriorating electrical property at last. To avoid the deterioration of electrical property, a following process is carried out at 300° C. to 450° C., by using a method such as O₂ plasma, N₂O plasma, UV/O₃ or the like. And further, an annealing process is performed at 650° C. to 850° C. for densifying the aluminum oxide film.

Referring to FIGS. 4A to 4E, there are provided cross sectional views setting forth a method for manufacturing a semiconductor device incorporating therein an aluminum oxide film in accordance with a fourth preferred embodiment by applying the aluminum oxide deposition method of the present invention.

Figure 4A:
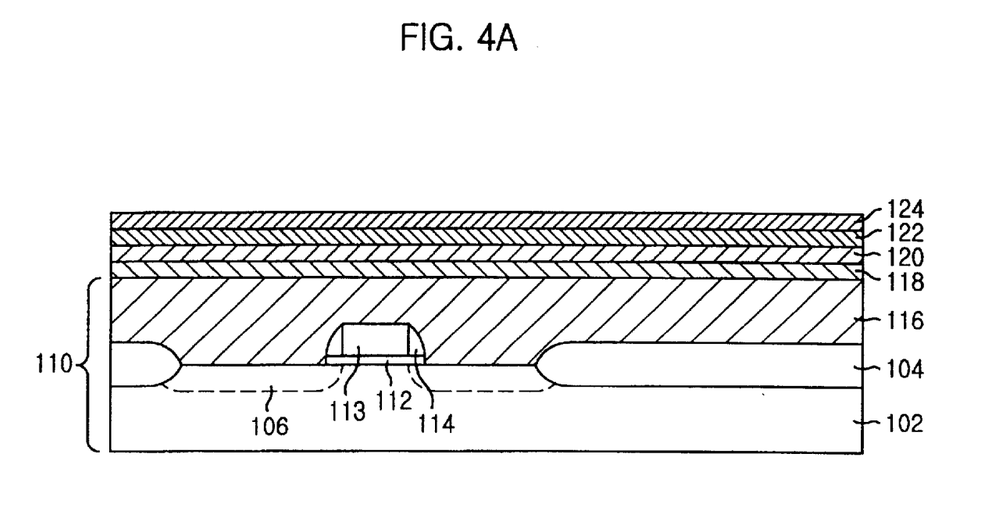
FIGS. 4A, 4B, 4C and 4E are cross sectional views setting forth a method for manufacturing a semiconductor device incorporating therein an aluminum oxide film in accordance with preferred embodiments of the present invention.

The process for manufacturing the semiconductor device begins with a preparation of an active matrix 110 including a semiconductor substrate 102, an isolation region 104, diffusion regions 106, a gate oxide 112, a gate line 113, a spacer 114 and a first insulating layer 116. One of the diffusion regions 106 serves as a source and the other diffusion region 106 serves as a drain.

Thereafter, a buffer layer 118, a first conductive layer 120, a dielectric layer 122 and a second conductive layer 124 are formed on top of the active matrix 118 subsequently, as shown in FIG. 4A. In the fourth preferred embodiment, the dielectric layer 122 is made of aluminum oxide (Al₂O₃) by using a method such as an atomic layer deposition (ALD) technique, wherein the deposition pressure is approximately 50 to 300 mTorr and the deposition temperature is kept at 200° C. to 450° C. Here, the buffer layer 118 is formed to improve adhesion between the first insulating layer 116 and the first conductive layer 120.

Since the method for depositing the aluminum oxide of the dielectric layer 122 is illustrated in the first, the second and the third embodiment, the detailed description will be abbreviated here.

Figure 4B:
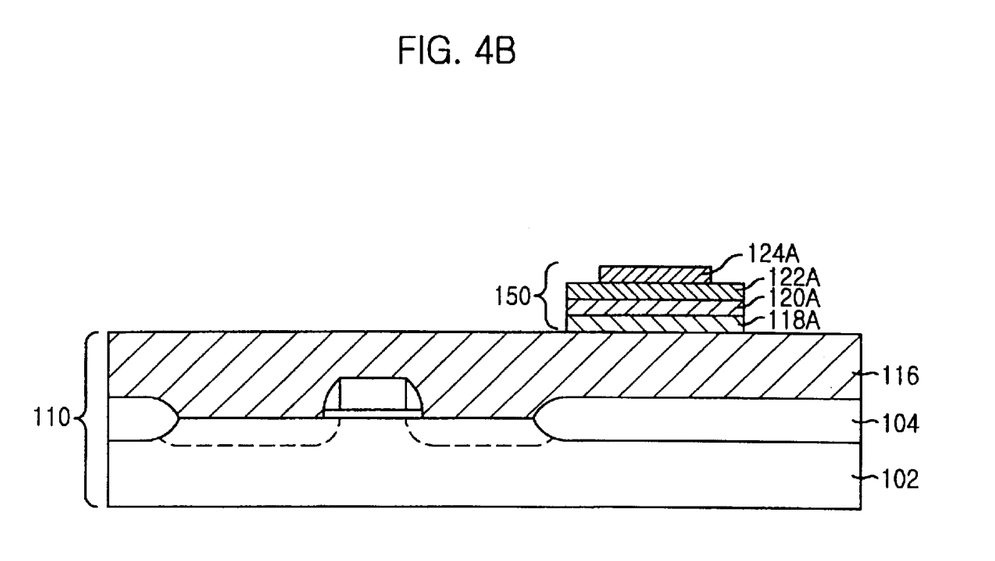

In a subsequent step, the second conductive layer 124, the dielectric layer 122, the first metal layer 120 and the buffer layer 118 are patterned into a predetermined configuration, thereby obtaining a capacitor structure 150 having a buffer 118A, a bottom electrode 120A, a capacitor thin film 122A and a top electrode 124A, as shown in FIG. 4B. It is preferable that the bottom electrode 120A has a size different from that of the top electrode 128A in order to form a plate line (not shown) during the following processes.

Figure 4C:
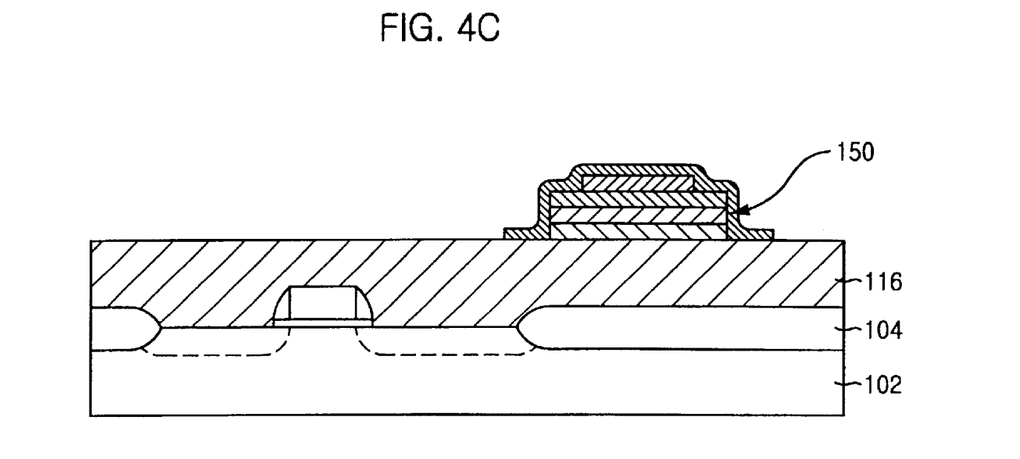

In a next step as shown in FIG. 1C, a hydrogen barrier layer of an aluminum oxide is formed on the capacitor structure 150 and portions of the first insulating layer 116, for preventing the capacitor structure 150 from hydrogen penetration thereinto during a post manufacturing process, e.g., a passivation process. Since, the method for forming the aluminum oxide layer by the ALD technique is same to those of the capacitor thin film 122A, the detailed description is abbreviated here.

Figure 4D:
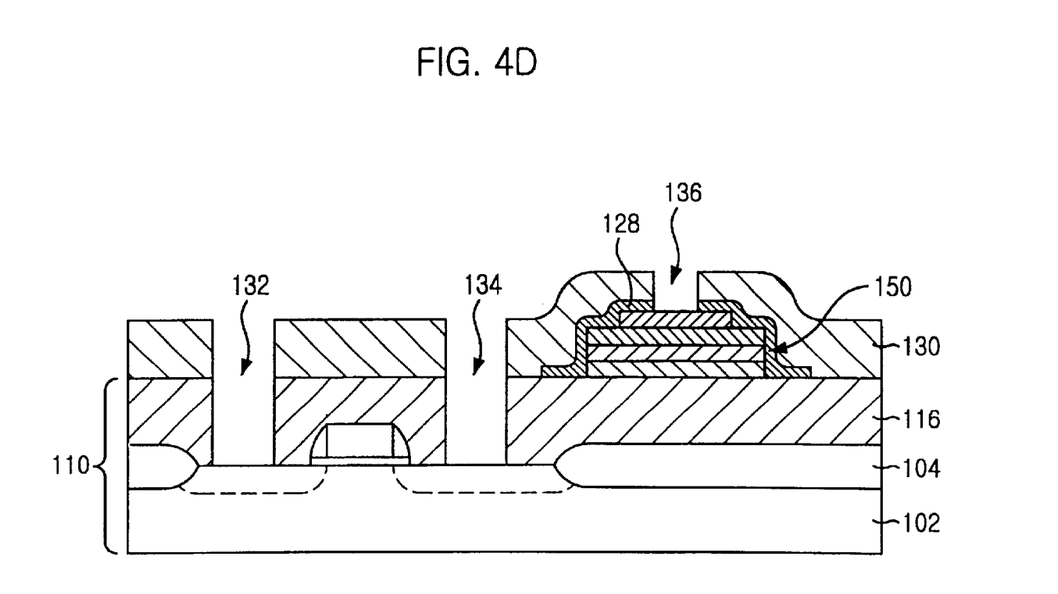
Figure 4E:
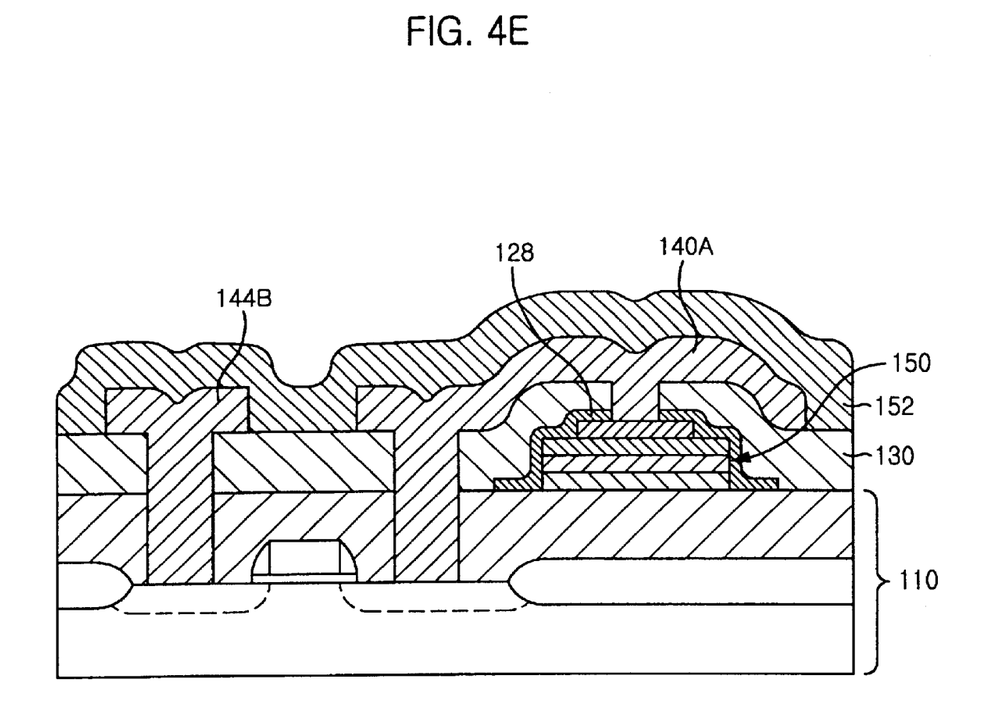

Thereafter, according to the exemplary process for fabricating the semiconductor device, a second insulating layer 130 is formed on the capacitor structure 150 and the first insulating layer 116. And then, they are patterned into a third predetermined configuration, thereby obtaining openings 132, 134, 136 as shown in FIG. 1D. In a subsequent step, a third conductive layer is formed on the entire surface including the interiors of the openings 132, 134, 136 and patterned so that a bit line 144B and a local interconnection 144A are obtained. And finally, a passivation layer 152 is formed on entire surface by using a CVD or PVD method as shown in FIG. 1E.

In the fourth embodiment of the present invention, the gate oxide film 112 can also be made of the aluminum oxide film by using the aluminum oxide deposition method of the present invention.

In comparison with the prior art, the present invention provides the aluminum oxide deposition method with the enhanced growth rate by supplying NH₃ reactive gas with the aluminum source material and/or the oxygen source material simultaneously. Moreover, by annealing the aluminum oxide film after depositing it completely on the wafer, it is possible to obtain the dense aluminum oxide film.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing an aluminum oxide film for use in a semiconductor device, the method comprising the steps of:
    a) preparing a semiconductor substrate and setting the semiconductor substrate in a reaction chamber;
    b) supplying an aluminum source material and NH₃ gas into the reaction chamber simultaneously for being absorbed on the semiconductor substrate;
    c) discharging an unreacted aluminum source material or by-product by flowing nitrogen gas into the reaction chamber or by vacuum purging;
    d) supplying an oxygen source material into the reaction chamber for being absorbed on the semiconductor substrate;
    e) discharging an unreacted oxygen source or by-product by flowing a nitrogen gas into the reaction chamber or by vacuum purging;
    f) removing carbon particles in the aluminum oxide film; and
    g) annealing the aluminum oxide film for densification thereof at 650° C. to 850° C. in N₂ rich atmosphere.

2. The method of claim 1, wherein steps b) to e) are carried out repeatedly by using an atomic layer deposition (ALD) technique until an aluminum oxide with a predetermined thickness is formed on the semiconductor substrate.

3. The method of claim 1, wherein a deposition temperature is kept at 200° C. to 450° C. and a deposition pressure is at 50 mTorr to 300 mTorr.

4. The method of claim 1, wherein the aluminum source material includes a metal-organic material of trimethyl aluminum (TMA) or modified trimethyl aluminum (MTMA).

5. The method of claim 1, wherein the aluminum source material and NH₃ gas are supplied, each through a separate supply-pipe into the reaction chamber for 0.1 to 3 seconds.

6. The method of claim 5, wherein the NH₃ gas is supplied at a flow rate of 20 sccm to 1,000 sccm.

7. The method of claim 1, wherein the oxygen source material includes vaporized water.

8. The method of claim 7, wherein the oxygen source material is supplied to the reaction chamber for 0.1 to 3 seconds.

9. The method of claim 1, wherein step f) is carried out at 300° C. to 450° C. by using O₂ plasma, N₂O plasma, or UV/O₃.

10. A method for manufacturing an aluminum oxide film for use in a semiconductor device, the method comprising the steps of:
    a) preparing a semiconductor substrate and setting the semiconductor substrate in a reaction chamber;
    b) supplying an aluminum source material into the reaction chamber for being absorbed the semiconductor substrate;
    c) discharging unreacted aluminum source material or by-product by flowing nitrogen gas into the reaction chamber or by vacuum purging;
    d) supplying an oxygen source material and a NH₃ gas into the reaction chamber for being absorbed on the semiconductor substrate;
    e) discharging an unreacted oxygen source or by-product by flowing a nitrogen gas into the reaction chamber or by vacuum purging;
    f) removing carbon particles in the aluminum oxide film; and
    g) annealing the aluminum oxide film for densification thereof at 650° C. to 850° C. in N₂ rich atmosphere.

11. The method of claim 10, wherein steps b) to e) are carried out repeatedly by using an atomic layer deposition (ALD) technique until the aluminum oxide with a predetermined thickness is formed on the semiconductor substrate.

12. The method of claim 10, wherein a deposition temperature is kept at 200° C. to 450° C. and a deposition pressure is at 50 mTorr to 300 mTorr.

13. The method of claim 10, wherein the aluminum source material includes a metal-organic material of trimethyl aluminum (TMA) or modified trimethyl aluminum (MTMA).

14. The method of claim 10, wherein the oxygen source material and NH₃ gas are supplied into the reaction chamber for 0.1 to 3 seconds through a same supply-pipe.

15. The method of claim 14, wherein the NH₃ gas is supplied at a flow rate of 20 sccm to 1,000 sccm.

16. The method of claim 10, wherein the oxygen source material includes vaporized water.

17. The method of claim 16, wherein the oxygen source material is supplied to the reaction chamber for 0.1 to 3 seconds.

18. The method of claim 10, wherein step f) is carried out at 300° C. to 450° C. by using O₂ plasma, N₂O plasma, or UV/O₃.

19. A method for manufacturing an aluminum oxide film for use in a semiconductor device, the method comprising the steps of:
    a) preparing a semiconductor substrate and setting the semiconductor substrate in a reaction chamber;
    b) supplying an aluminum source material and a NH₃ gas into the reaction chamber simultaneously for being absorbed on the semiconductor substrate;
    c) discharging unreacted aluminum source material or by-product by flowing nitrogen gas into the reaction chamber or by vacuum purging;
    d) supplying an oxygen source material and a NH₃ gas into the reaction chamber for being absorbed on the semiconductor substrate;
    e) discharging an unreacted oxygen source or by-product by flowing nitrogen gas into the reaction chamber or by vacuum purging;
    f) removing carbon particles in the aluminum oxide film; and
    g) annealing the aluminum oxide film for densification thereof at 650° C. to 850° C. in N₂ rich atmosphere.

20. The method of claim 19, wherein steps b) to e) are carried out repeatedly by using an atomic layer deposition (ALD) technique until an aluminum oxide with a predetermined thickness is formed on the semiconductor substrate.

21. The method of claim 19, wherein a deposition temperature is kept at 200° C. to 450° C. and a deposition pressure is at 50 mTorr to 300 mTorr.

22. The method of claim 19, wherein the aluminum source material includes a metal-organic material of trimethyl aluminum (TMA) or modified trimethyl aluminum (MTMA).

23. The method of claim 19, wherein the aluminum source material and $NH_3$ gas are supplied, each through a separate supply-pipe, into the reaction chamber for 0.1 to 3 seconds and the aluminum source material and $NH_3$ gas are supplied into the reaction chamber for 0.1 to 3 seconds through a same supply-pipe.

24. The method of claim 23, wherein $NH_3$ gas is supplied at a flow rate of 20 sccm to 1,000 sccm.

25. The method of claim 19, wherein the oxygen source material is vaporized water.

26. The method of claim 25, wherein the oxygen source material is supplied to the reaction chamber for 0.1 to 3 seconds.

27. The method of claim 19, wherein step f) is carried out at 300° C. to 450° C. by using $O_2$ plasma, $N_2O$ plasma, or $UV/O_3$.

28. A method for manufacturing a semiconductor device, the method comprising the steps of:
  a) preparing an active matrix provided with a substrate, isolation regions, a gate line, a gate oxide and a first insulating layer;
  b) forming sequentially buffer layer and a first conductive layer on the active matrix;
  c) forming a dielectric layer having an aluminum oxide ($Al_2O_3$) on the first conductive layer using an atomic layer deposition (ALD) technique, by supplying a $NH_3$ reactive gas with an aluminum source and/or an oxygen source;
  d) forming a second conductive layer on the dielectric layer and patterning the second conductive layer, the dielectric layer, the first conductive layer and the buffer layer, thereby obtaining a capacitor structure;
  e) forming a hydrogen barrier layer on the capacitor structure;
  f) forming a bit line and a local interconnection after depositing a second insulating layer;
  g) forming a passivation layer on entire surface of the substrate.

29. The method of claim 28, wherein the gate oxide includes aluminum oxide formed by using an atomic layer deposition (ALD) technique, by supplying the $NH_3$ reactive gas with the aluminum source and/or oxygen source.

30. The method of claim 29, wherein the hydrogen barrier layer includes an aluminum oxide formed by using an atomic layer deposition (ALD) technique, by supplying $NH_3$ reactive gas with an aluminum source and/or an oxygen source.

31. The method of claim 28, after step c), further comprising the step of annealing the dielectric layer for densification thereof.

32. The method of claim 31, wherein the step of annealing the dielectric layer is carried out at 650° C. to 850° C. in a $N_2$ rich ambient.

* * * * *

UNITED STATES PATENT AND TRADEMARK OFFICE
CERTIFICATE OF CORRECTION

PATENT NO. : 6,723,598 B2
DATED : April 20, 2004
INVENTOR(S) : Lim et al.

It is certified that error appears in the above-identified patent and that said Letters Patent is hereby corrected as shown below:

<u>Title page,</u>
Item [*] Notice, delete the phrase "by 0" and insert -- by 82 days --

Signed and Sealed this

Tenth Day of May, 2005

JON W. DUDAS
*Director of the United States Patent and Trademark Office*